(12) United States Patent
Totsuka et al.

(10) Patent No.: US 9,678,223 B2
(45) Date of Patent: Jun. 13, 2017

(54) SCINTILLATOR

(75) Inventors: Daisuke Totsuka, Ageo (JP); Susumu Matsumoto, Ageo (JP); Akira Yoshikawa, Sendai (JP); Takayuki Yanagida, Sendai (JP)

(73) Assignee: NIHON KESSHO KOGAKU., LTD., Tatebayashi (JP)

( * ) Notice: Subject to any disclaimer, the term of this patent is extended or adjusted under 35 U.S.C. 154(b) by 0 days.

(21) Appl. No.: 14/239,366

(22) PCT Filed: Aug. 17, 2012

(86) PCT No.: PCT/JP2012/070911
§ 371 (c)(1),
(2), (4) Date: Feb. 18, 2014

(87) PCT Pub. No.: WO2013/027671
PCT Pub. Date: Feb. 28, 2013

(65) Prior Publication Data
US 2014/0203211 A1 Jul. 24, 2014

(30) Foreign Application Priority Data

Aug. 19, 2011 (JP) ................................ 2011-179703

(51) Int. Cl.
| *C09K 11/74* | (2006.01) |
| *G01T 1/202* | (2006.01) |
| *C30B 29/12* | (2006.01) |
| *C09K 11/02* | (2006.01) |
| *G21K 4/00* | (2006.01) |
| *C30B 11/00* | (2006.01) |
| *C30B 15/00* | (2006.01) |

(52) U.S. Cl.
CPC .......... *G01T 1/2023* (2013.01); *C09K 11/025* (2013.01); *C09K 11/7435* (2013.01); *C30B 29/12* (2013.01); *G21K 4/00* (2013.01); *C30B 11/00* (2013.01); *C30B 15/00* (2013.01); *G21K 2004/06* (2013.01)

(58) Field of Classification Search
CPC . C09K 11/025; C09K 11/7435; C09K 11/615; C09K 11/61; C09K 11/74; G21K 4/00; G21K 2004/06; C30B 11/00; C30B 29/12; C30B 15/00; G01T 1/202; G01T 1/2023; G01T 1/2012; G01T 1/2033
USPC ....... 252/301.17, 301.4 H, 301.4 F, 301.4 R; 250/361 R, 370.11, 370.09, 367, 484.5, 250/484.3, 484.4; 430/270.1
See application file for complete search history.

(56) References Cited

U.S. PATENT DOCUMENTS

| 7,368,719 | B2 | 5/2008 | Srivastava et al. | |
| 7,652,255 | B2 | 1/2010 | Fuchs et al. | |
| 8,674,309 | B2 | 3/2014 | Yasui et al. | |
| 8,993,969 | B2 | 3/2015 | Yasui et al. | |
| 2006/0063155 | A1* | 3/2006 | Kohler et al. | ..................... 435/6 |
| 2008/0001086 | A1 | 1/2008 | Srivastava et al. | |
| 2008/0054222 | A1 | 3/2008 | Sakai et al. | |
| 2008/0224048 | A1* | 9/2008 | Fuchs | ...................... G21K 4/00 250/361 R |
| 2012/0104266 | A1* | 5/2012 | Yokosawa | ............... G01T 1/202 250/369 |
| 2012/0292516 | A1 | 11/2012 | Yasui et al. | |
| 2014/0319362 | A1 | 10/2014 | Yasui et al. | |

FOREIGN PATENT DOCUMENTS

| CN | 101223258 A | 7/2008 |
| CN | 101479361 A | 7/2009 |
| GB | 538178 A * | 7/1941 |
| JP | 4877752 | 6/1973 |
| JP | 2008215951 | 9/2008 |
| WO | 2008029602 A1 | 3/2008 |
| WO | 2011/093176 A2 | 8/2011 |

OTHER PUBLICATIONS

Totsuka et al., "Afterglow Suppression by Codoping with Bi in CsI:T1 Crystal Scintillator", Apr. 20, 2012, Applied Physics Express 5, The Japan Society of Applied Physics, pp. 052601-1 to 052601-3 . . . .*
Totsuka et al., "Afterglow Suppression by Codoping with Bi in CsI:T1 Crystal Scintillator", Applied Physics Express 5, 2012, pp. 1-3, 052601, The Japan Society of Applied Physics.
http://www.nss-mic.com/2012/Program/ListProgramDB. asp?session=N26; Aug. 8, 2013.
Brecher, C. et al., "Suppression of afterglow in CsI:T1 by codoping with Eu2+-I: Experimental", Nuclear Instruments and Methods in Physics Research A, 558 (2006), pp. 450-457.
Getkin, A. V., et al., "The Effect of Bi- and Trivalent Cation Impurities on the Luminescence CsI", IEEE Transactions on Nuclear Science, vol. 42, No. 4, Aug. 1995.

* cited by examiner

Primary Examiner — Matthew E Hoban
Assistant Examiner — Lynne Edmondson
(74) Attorney, Agent, or Firm — The Webb Law Firm

(57) ABSTRACT

An afterglow property of cesium iodide:thallium (CsI:Tl), in which CsI is a host material and doped with thallium, is improved. It is possible to improve the afterglow property of a scintillator by doping a crystal material including CsI (cesium iodide), as a host material, and thallium (Tl), as a luminescent center, with bismuth (Bi).

10 Claims, 2 Drawing Sheets

SCINTILLATOR

CROSS-REFERENCE TO RELATED APPLICATIONS

This application is the United States national phase of International Application No. PCT/JP2012/070911 filed Aug. 17, 2012, and claims priority to Japanese Patent Application No. 2011-179703 filed Aug. 19, 2011, the disclosures of which are hereby incorporated in their entirety by reference.

TECHNICAL FIELD

The present invention relates to a scintillator suitably usable, for example, for an X-ray detector and the like.

BACKGROUND ART

A scintillator is a material which absorbs a radiation, such as γ-ray or X-ray, and emits an electromagnetic wave with a wavelength of visible light or near visible light. The applications thereof include various types of radiation detectors, such as medical positron emission tomography (PET), time-of-flight positron emission tomography (TOF-PET), and X-ray computed tomography (X-ray CT), and further a survey instrument for the inspection of personal belongings used at an airport and the like.

Such a radiation detector generally consists of a scintillator unit, which absorbs a radiation and converts it into visible light, and a light detector, such as a photomultiplier tube (hereinafter, referred to as "PMT") or a photodiode, which detects the visible light converted in the scintillator unit and transmitted therethrough and converts it into an electrical signal. Thus, the scintillator used for this type of applications is desired to be a scintillator with a high output level of light emission in order to reduce noise and increase measurement accuracy.

As a scintillator, in the related art, an alkali halide crystal, such as CsI or NaI, has been widely practically used. Among them, a scintillator having CsI, as the host material, is used in terms of that the efficiency of radiation absorption thereof is relatively high, the radiation damage thereof is relatively small, and it is relatively easy to manufacture a thin film thereof by a vacuum deposition and the like.

However, in a CsI scintillator of the related art, light emission efficiency is not so high and the decay time of the fast component of fluorescence is not sufficiently short, and thus scintillators, such as CsI:Na and CsI:Tl, which are doped with thallium iodide (TlI), in which the efficiency of scintillation is increased by doping a crystal having CsI, as the host material, with impurities are practically used. In JP 2008-215951A, for example, cesium iodide:thallium (CsI:Tl), in which cesium iodide (CsI) is doped with thallium (Tl), is disclosed.

When cesium iodide:thallium (CsI:Tl), in which CsI is a host material and doped with thallium, is used as a scintillator, it is possible to obtain a high output level by combining with a photodiode, as a detector, but there is also a problem that an afterglow, which tends to obscure the image, is caused. Especially, when an instrument for hand baggage inspection or the like images a moving object, the afterglow property is important, and hence this problem needs to be solved.

Thus, the invention is to provide a novel scintillator, in which the afterglow property of cesium iodide:thallium (CsI:Tl), in which CsI is the host material and doped with thallium, is improved.

SUMMARY OF THE INVENTION

The invention suggests a scintillator obtained by doping a crystal material including CsI (cesium iodide), as a host material, and thallium (Tl), as a luminescent center, with bismuth (Bi).

Such a scintillator is a novel crystal material having a different composition from the material disclosed in the related art, and enables to significantly improve the afterglow property of cesium iodide:thallium (CsI:Tl), in which CsI is the host material and doped with thallium. Accordingly, when the scintillator suggested by the invention is used, it is possible to obtain, for example, an X-ray detector with a high output level of light emission.

BEST MODE(S) FOR CARRYING OUT THE INVENTION

Figure 1:
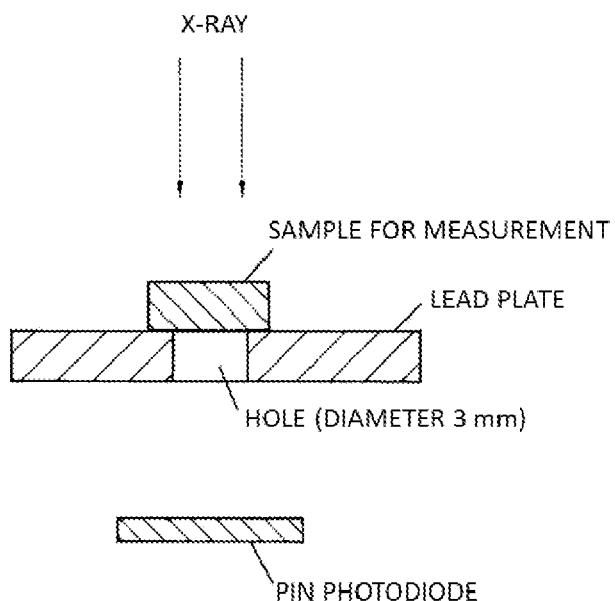
FIG. 1 is a diagram illustrating a configuration (overview) of an apparatus used for the measurement of an output in Examples.

Hereinafter, embodiments of the invention will be described in detail. However, the scope of the invention is not limited to the embodiments described below.

(Scintillator)

A scintillator according to the present embodiment (hereinafter, referred to as a "present scintillator") is a scintillator having a configuration, in which a crystal material including CsI (cesium iodide), as a host (host material), and thallium (Tl), as a luminescent center, is doped with bismuth (Bi).

As above, by doping a crystal material including CsI (cesium iodide), as a host material, and thallium (Tl), as a luminescent center, with bismuth (Bi), it is possible to reduce an afterglow, which is the problem of this type of scintillator. It is considered that such an action of reducing the afterglow of the scintillator is possible since the energy emitted by the lattice defect inherently present in CsI crystal or by the crystal defect due to substitution of thallium (Tl) in the CsI crystal is consumed as transition energy of bismuth (Bi) in a non-emission state.

The doping amount of thallium (Tl) is not particularly limited. In general, it is preferable to perform doping such that the concentration of thallium (Tl) is 0.05 at. % to 1.00 at. % with respect to Cs of CsI (cesium iodide). When the doping amount of thallium (Tl) is 0.05 at. % or more, it is possible to obtain the grown crystal scintillating in a sufficient light emission efficiency. On the other hand, when the doping amount of thallium (Tl) is 1.00 at. % or less, it is possible to avoid that the amount of light emission becomes less due to concentration quenching.

From the viewpoint described above, the doping amount of thallium (Tl) is preferably 0.05 at. % to 1.00 at. %, particularly 0.10 at. % or more or 0.75 at. % or less, among them, particularly 0.20 at. % or more or 0.50 at. % or less with respect to Cs of CsI (cesium iodide).

It is demonstrated that when the doping amount of bismuth (Bi) is too little, the improvement of the afterglow property is not effectively achieved, and when the doping amount is too much, the afterglow property is improved but the output property is damaged. From the viewpoint described above, the doping amount of bismuth (Bi) is preferably as follows. It is preferable to perform doping such that the concentration of bismuth (Bi) is 0.01 at. % to 0.100 at. %, among them, 0.001 at. % or more or 0.020 at. % or less, among them, 0.001 at. % or more or 0.010 at. % or less with respect to Cs of CsI (cesium iodide).

Here, the doping amount of each of the elements means the addition rate of each of the elements with respect to Cs in CsI during the crystal growth.

As confirmed in Examples, which will be described below, the doping amount of thallium (Tl) was compared with the content of thallium (Tl) actually incorporated in the crystal, and, as a result, it was confirmed that the content of thallium (Tl) actually incorporated in the crystal was 20% to 70% of the doping amount. Accordingly, it is found that in a case where the doping amount of thallium (Tl) is 0.05 at. % to 1.00 at. %, the content of thallium (Tl) is 0.015 at. % to 0.700 at. %.

On the other hand, in regard to bismuth (Bi) as well, the doping amount of bismuth (Bi) was compared with the content of bismuth (Bi) actually incorporated in the crystal, and, as a result, it was confirmed that the content of bismuth (Bi) actually incorporated in the crystal was 0.7% to 6% of the doping amount. Accordingly, it is found that in a case where the doping amount of bismuth (Bi) is 0.001 at. % to 0.100 at. %, the content of bismuth (Bi) is $7.0 \times 10^{-6}$ at. % to $6.0 \times 10^{-3}$ at. %.

The form of the present scintillator may be any of a bulk form, a column form, and a thin film form, and the effect of reducing the afterglow is achieved in any forms.

In addition, the present scintillator may be a single crystal or a polycrystal since the effect of reducing the afterglow is achieved in both cases of a single crystal and a polycrystal.

At this time, a single crystal according to the invention is, as confirmed in Examples, a crystal confirmed as a crystal substance of CsI single phase when the crystal is measured by X-ray diffraction (XRD).

(Application)

A radiation detector, such as an X-ray detector or a γ-ray detector, may be configured by combining the present scintillator with a photodetection unit, such as PMT or a photodiode. Among them, the present scintillator may be suitably used as a scintillator of various types of X-ray detectors, such as medical positron emission tomography (PET), time-of-flight positron emission tomography (TOF-PET), and X-ray computed tomography (X-ray CT), and a radiation detector, such as various types of X-ray detectors or γ-ray detectors may be configured using this scintillator.

(Production Method)

Next, a method of producing the present scintillator will be described. However, the production method of the present scintillator is not limited to the method described below.

The present scintillator may be obtained by subjecting to the crystal growth after mixing the raw material including a CsI raw material, a Tl raw material, and a Bi raw material and melting the raw material by heating.

At this time, as the Tl raw material and the Bi raw material, a halide of Tl or Bi such as thallium Iodide or bismuth iodide, an oxide of Tl or Bi, a metal of Tl or Bi, a metallic compound of Tl or Bi, or the like may be exemplified. However, the examples thereof are not limited thereto.

The method of crystal growth at this time is not particularly limited, and, for example, known methods of crystal growth such as the Bridgman-Stockbarger technique (also referred to as "BS technique"), a temperature gradient fixation method (for example, VGF method), the Czochralski process (also referred to as "CZ process"), the Kyropoulos method, a micro-pulling-down method, the Zone melting method, a modified method thereof, and other methods of crystal growth from melt may be appropriately employed.

Representative BS technique and CZ process will be described below.

The BS technique is a method for growing a crystal from the crucible bottom while pulling down the crucible after introducing and melting the raw material in the crucible. The technique is characterized by that the apparatus for crystal growth is relatively inexpensive and it is possible to relatively easily grow a crystal with a large diameter. On the other hand, it is said that the control of the crystal growth orientation is difficult, and since unreasonable stress is loaded during the crystal growth or cooling, stress distribution is remained in the crystal and thus, deformation or dislocation of the crystal is easily induced.

Meanwhile, the CZ process is a method, in which a raw material is introduced into a crucible and melted, a seed (seed crystal) is brought into contact with the surface of the melt, and a crystal is grown (crystallization) while rotation and pulling are performed. It is said that in the CZ process, since a crystal orientation can be specified and crystallized, the crystal orientation easily grows to a target level.

An example of the BS technique according to an example of the crystal growth method will be specifically described. For example, CsI powder, TlI powder, and $BiI_3$ powder, which are raw materials, are weighed by a predetermined amount and mixed, and this mixture is filled in a quartz ampoule and the ampoule is vacuum sealed. A seed crystal may be put in the bottom of the ampoule as necessary. This quartz ampoule is installed in the crystal growth apparatus. As the atmosphere of the inside of the crystal growth apparatus, an atmosphere appropriate for the material of a heater to be used is selected. The quartz ampoule is heated by a heating apparatus to melt the raw materials in the ampoule.

After the raw materials in the ampoule is molten, when the ampoule is pulled down to the vertically downward direction at a velocity of about 0.1 mm/hour to 3 mm/hour, solidification of the molten raw materials is initiated in the bottom of the ampoule and a crystal grows. When the solidification of the whole melt in the ampoule is completed, the pulling down of the ampoule is terminated, and cooling is performed to about room temperature along with performing gradient cooling by a heating apparatus, whereby growth of a crystal with an ingot shape is possible.

The crystal with an ingot shape grown in the above described manner may be cut into a predetermined size and processed into a desired form of scintillator.

It is possible to subject the crystal to a heat treatment as necessary, but it does not necessarily need to perform a heat treatment.

As a method of the heat treatment, for example, the crystal grown by the process described above is put into a container, and the container is installed in a heat treat furnace and isothermally heated such that the temperature inside the heat treat furnace becomes a temperature of about 80% to 90% of the melting point, whereby it is possible to remove the deformation remained in the crystal. The atmosphere in the heat treatment may be an inert gas atmosphere, such as high purity argon (Ar) gas. However, the method of the heat treatment is not limited to such a method.

(Explanation of Terms)

In the invention, the term "X-ray scintillator" means a material, which absorbs X-ray, and emits an electromagnetic wave (scintillation light) with a wavelength of visible light or near visible light (the wavelength region of the light may extend from near ultraviolet to near infrared), and a constituent member of a radiation detector equipped with such a function.

In addition, the term "scintillator" means a material, which absorbs a radiation, such as X-ray or γ-ray, and emits an electromagnetic wave (scintillation light) with a wavelength of visible light or near visible light (the wavelength region of the light may extend from near ultraviolet to near infrared), and a constituent member of a radiation detector equipped with such a function.

In the invention, when the term "X to Y" (X and Y are an arbitrary figure) is described, unless otherwise stated, it includes the meaning of "preferably greater than X" or "preferably smaller than Y" together with the meaning of "X or greater and Y or smaller".

In addition, when the term "X or greater" (X is an arbitrary figure) or "Y or smaller" (Y is an arbitrary figure) is described, it includes the intention of "it is preferable to be greater than X" or "it is preferable to be smaller than Y".

EXAMPLES

Hereinafter, Examples of the invention will be described. However, the scope of the invention is not limited to the following Examples.

<Output>

Output (nA) and afterglow (ppm) are measured using the measuring apparatus illustrated in FIG. 1.

A sample for measurement (scintillator disc) with a diameter of 8 mm and a thickness of 2 mm is used.

At this time, the output is an output of a photodiode when the scintillation light generated at a sample for measurement by irradiating the sample for measurement with predetermined X-ray is absorbed by a PIN photodiode, and the afterglow is an afterglow at a predetermined time after X-ray radiation.

A target formed of tungsten (W) was irradiated with an electron ray having an applied voltage of 120 kV and an applied current of 20 mA to generate X-ray, the sample for measurement was irradiated with this X-ray, and the output of the scintillation light and transmitted X-ray was measured by a PIN photodiode (S1723-5 manufactured by Hamamatsu Photonics K. K.). Next, the hole of the lead plate was shielded with a light shielding tape to shield the scintillation light, and only the output of the transmitted X-ray was measured. Then, the output according to the transmitted X-ray was subtracted from the output of the scintillation light and transmitted X-ray to obtain the output according to the scintillation light.

In addition, in the same manner as above, irradiation with an electron ray of 120 kV and 20 mA was performed to generate X-ray, the sample for measurement was irradiated with this X-ray for one second, and the current value (I) flowing in the PIN photodiode (S1723-5 manufactured by Hamamatsu Photonics K. K.) was measured. Next, the sample for measurement was irradiated with this X-ray, and then irradiation with X-ray was cut and the current value ($I_{20\,ms}$) flowing in the PIN photodiode was measured in 20 ms after cutting. In addition, in the state before that the sample for measurement was irradiated with X-ray, the current value flowing in the PIN photodiode was measured as the background value ($I_{bg}$). The afterglow (20@ms) was calculated from the following expression.

$$\text{Afterglow}(20@\text{ms})=(I_{20\,ms}-I_{bg})/(I-I_{bg})$$

<Measurement of XRD>

For the measurement of X-ray diffraction (XRD), "RINT-2000 (40 kV, 40 mA)" manufactured by Rigaku Corporation was used as a measuring apparatus, and a Cu target was used as a radiation source. An XRD pattern, in which 2θ was in the range of 10 degrees to 80 degrees, was obtained.

Reference Examples 1 and 2, Examples 1 to 6, Comparative Examples 1 to 6

Figure 2:
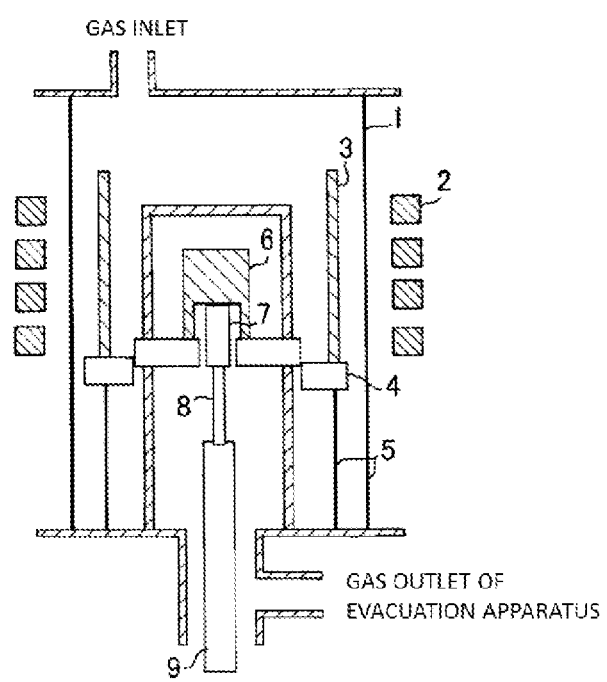
FIG. 2 is a diagram illustrating a configuration (overview) of an apparatus for crystal growth used in production of Examples.

Each of the raw materials was weighed by a predetermined amount such that the amount of each of the elements is the value shown in Table 1, and mixed in a mortar, and then the mixture was set in a crystal growth apparatus illustrated in FIG. 2 and a crystal growth was performed. Here, doping amount of each of the added elements was expressed by atomic number percentage (at. %) with respect to Cs element in CsI, which is the host material.

Incidentally, CsI powder (99.999%) was used as the CsI raw material, TlI powder (99.999%) as the Tl raw material, $BiI_3$ powder (99.999%) as the Bi raw material, AgI powder (99.999%) as the Ag raw material, $SmI_2$ powder (99.9%) as the Sm raw material, $YbI_3$ powder (99.9%) as the Yb raw material, $TmI_2$ powder (99.9%) as the Tm raw material, $EuI_2$ powder (99.9%) as the Eu raw material, and $PbI_2$ powder (99.9%) as the Pb raw material.

The crystal growth was performed according to the vertical Bridgman technique below. That is, into a quartz ampoule with a cylindrical part diameter of 8 mm and a tip part diameter of 2 mm, water with 10% HF was introduced and washing was performed for 4 hours. After carefully washing the quartz ampoule with water in this manner, the quartz ampoule was heated at 250° C. to dry while performing vacuum drawing using a rotary pump such that the pressure inside the ampoule becomes 10 torr.

Into the quartz ampoule pretreated in this manner, the raw materials mixed in the mortar as above was introduced, the quartz ampoule including the raw materials was heated at 250° C. to remove moisture included in the raw materials while performing vacuum drawing at 10 torr using a rotary pump, and then the quartz ampoule was heated and molten using a burner while maintaining the vacuum state so that the raw materials was sealed in the quartz ampoule.

Next, the quartz ampoule was set in a furnace with an Ar gas atmosphere and heated by a heater until the raw materials were molten, and the temperature thereof was maintained as it was for 1 hour after the raw materials were molten. Thereafter, the quartz ampoule was pulled down at a velocity of 0.06 mm/min for 8 hours, and then pulling down was stopped and heating by the heater was gradually stopped over 10 hours.

The crystal obtained in this manner was cut to a predetermined size and a predetermined direction, and the cut pieces were used as the samples for respective measurements.

TABLE 1

| | Doping amount (at. %) | Output (nA) @120 kV | Afterglow (ppm) @120 kV |
|---|---|---|---|
| Reference Example 1 | Not added | 7.64 | 18408 |
| Reference Example 2 | Tl: 0.1 | 53.89 | 3731 |

TABLE 1-continued

| | Doping amount (at. %) | Output (nA) @120 kV | Afterglow (ppm) @120 kV |
|---|---|---|---|
| Example 1 | Bi: 0.1, Tl: 0.1 | 27.92 | 2644 |
| Example 2 | Bi: 0.01, Tl: 0.1 | 21.96 | 1607 |
| Example 3 | Bi: 0.001, Tl: 0.1 | 36.54 | 2037 |
| Example 4 | Bi: 0.01, Tl: 1.0 | 37.92 | 1731 |
| Example 5 | Bi: 0.01, Tl: 0.5 | 40.61 | 723 |
| Example 6 | Bi: 0.01, Tl: 0.05 | 39.97 | 463 |
| Comparative Example 1 | Ag: 0.1, Tl: 0.1 | 55.41 | 7891 |
| Comparative Example 2 | Sm: 0.1, Tl: 0.1 | 39.43 | 4100 |
| Comparative Example 3 | Yb: 0.1, Tl: 0.1 | 40.14 | 5317 |
| Comparative Example 4 | Tm: 0.1, Tl: 0.1 | 40.03 | 9341 |
| Comparative Example 5 | Eu: 0.1, Tl: 0.1 | 41.99 | 8927 |
| Comparative Example 6 | Pb: 0.1, Tl: 0.1 | 29.81 | 21506 |

(Results and Discussion)

A part of the crystals obtained in Examples 1 to 6 was crushed and the X-ray diffraction (XRD) of the powder was measured. As a result, any of the crystals obtained in Examples 1 to 6 was a single crystal of CsI, and other phases were not confirmed.

The crystal material including CsI (cesium iodide) as the host material, and thallium (Tl) as the luminescent center, as above was further doped with various elements. As a result, the afterglow was reduced by doping with bismuth (Bi), and this result was an effect which was not possible to obtain with other elements.

In addition, from the results of the test described above and the tests so far, from the viewpoint of that it is possible to reduce the afterglow, the following facts are found. It is preferable to perform doping with thallium (Tl) such that the amount of thallium (Tl) is 0.05 at. % to 1.00 at. %, particularly 0.10 at. % or more or 0.75 at. % or less, among them, particularly 0.20 at. % or more or 0.50 at. % or less with respect to Cs of CsI (cesium iodide). At that time, it is preferable to perform doping with bismuth (Bi) such that the amount of bismuth (Bi) is 0.001 at. % to 0.100 at. %, among them, 0.001 at. % or more or 0.020 at. % or less, among them, 0.001 at. % or more or 0.010 at. % or less with respect to Cs of CsI (cesium iodide).

In Examples described above, the test was performed using a scintillator of a bulk form, but when scintillators of a column form and a thin film form are produced, the lattice defect in the CsI crystal is greater, and thus an effect greater than that of bulk form is expected. That is, regardless of that the form of the scintillator is a bulk form, a column form, and a thin film form, it is possible to expect an effect, which is at least the same as or higher than when the scintillator of a bulk form is used.

<Relation Between Doping Amount and Content>

Here, the relation between the doping amount of thallium (Tl) and bismuth (Bi) and the content of thallium (Tl) and bismuth (Bi) actually incorporated in the crystal was investigated.

A part of the crystals obtained in Examples 1 to 6 was taken, and the concentrations of the added elements included in the crystals were analyzed using these as samples for the concentration analysis.

For the elementary analysis for Tl and Bi, an inductively coupled plasma mass spectrometry (ICP-MS) instrument (model: SPS 3000) was used to obtain a weight percentage (wt. %) of the sample. From the content represented by the weight percentage thus obtained, the atomic number percentage (at. %) of Tl element and the atomic number percentage (at. %) of Bi element with respect to Cs in CsI were calculated, respectively. The results are shown in Table 2.

TABLE 2

| | Doping amount of Bi (at. %) | Concentration of Bi contained ($\times 10^{-4}$ at. %) | Doping amount of Tl (at. %) | Concentration of Tl contained (at. %) |
|---|---|---|---|---|
| Example 1 | 0.1 | 54 | 0.1 | 0.039 |
| Example 2 | 0.01 | 4 | 0.1 | 0.032 |
| Example 3 | 0.001 | 0.7 | 0.1 | 0.031 |
| Example 4 | 0.01 | 6 | 1.0 | 0.39 |
| Example 5 | 0.01 | Not performed | 0.5 | Not performed |
| Example 6 | 0.01 | 5 | 0.05 | 0.015 |

From this result, the doping amount of thallium (Tl) was compared with the content of thallium (Tl) actually incorporated in the crystal, and it was confirmed that the content of thallium (Tl) actually incorporated in the crystal was 20% to 70% of the doping amount. Accordingly, it is found that in a case where the doping amount of thallium (Tl) is 0.05 at. % to 1.00 at. % with respect to Cs of CsI (cesium iodide), the content of thallium (Tl) is 0.015 at. % to 0.700 at. % with respect to Cs of CsI (cesium iodide).

Meanwhile, in regard to bismuth (Bi) as well, the doping amount of bismuth (Bi) was compared with the content of bismuth (Bi) actually incorporated in the crystal, and, as a result, it was confirmed that the content of bismuth (Bi) actually incorporated in the crystal was 0.7% to 6% of the doping amount. Accordingly, it is found that in a case where the doping amount of bismuth (Bi) is 0.001 at. % to 0.100 at. % with respect to Cs of CsI (cesium iodide), the content of bismuth (Bi) is $7.0 \times 10^{-6}$ at. % to $6.0 \times 10^{-3}$ at. % with respect to Cs of CsI (cesium iodide).

Example 7

Crystal growth was performed according to the same procedure described in Examples 1 to 6 except that a cylindrical quartz ampoule with a cylindrical part diameter of 1 inch was used, and powders of the raw materials were weighed and mixed such that, among the raw materials, the doping amount of added elements was 0.50 at. % for Tl and 0.01 at. % for Bi, and sealed in the quartz ampoule. In addition, samples were taken from parts, which have different proportions of solidification, of the crystal thus obtained, and subjected to the evaluation of the output property and afterglow property as well as the analysis in the same manner as above.

Example 8

Crystal growth was performed according to the same procedure described in Examples 1 to 6 except that a cylindrical quartz ampoule with a cylindrical part diameter of 2 inch was used, and powders of the raw materials were weighed and mixed such that, among the raw materials, the doping amount of added elements was 0.50 at. % for Tl and 0.001 at. % for Bi, and sealed in the quartz ampoule. In addition, samples were taken from the parts, which have different proportions of solidification, of the crystal thus obtained, and subjected to the evaluation of the output property and afterglow property as well as the analysis in the same manner as above.

TABLE 3

| | Doping amount | Proportion of solidification of the sampling part for measurement | Concentration of Tl contained (at. %) | Concentration of Bi contained (at. %) | Output (nA) | Afterglow (ppm) |
|---|---|---|---|---|---|---|
| Example 7 | Tl: 0.50 at. % | 0.18 | 0.20 | $1.4 \times 10^{-4}$ | 43.06 | 1027 |
| | Bi: 0.01 at. % | 0.81 | 0.50 | $5.2 \times 10^{-4}$ | 36.69 | 851 |
| Example 8 | Tl: 0.50 at. % | 0.18 | 0.092 | $9.3 \times 10^{-6}$ | 48.19 | 965 |
| | Bi: 0.001 at. % | 0.74 | 0.65 | $1.2 \times 10^{-4}$ | 38.99 | 1300 |

A part of the crystals obtained in Examples 7 and 8 was crushed and the X-ray diffraction (XRD) of the powder was measured. As a result, any of the crystals obtained in Examples 7 and 8 was a single crystal of CsI, and other phases were not confirmed.

In regard to Examples 7 and 8 as well, it is found that by doping the crystal material including CsI (cesium iodide) as the host material, and thallium (Tl) as the luminescent center, with bismuth (Bi), it is possible to reduce the afterglow.

From this result as well, it is confirmed that it is preferable to perform doping with thallium (Tl) such that the amount of thallium (Tl) is 0.05 at. % to 1.00 at. %, particularly 0.10 at. % or more or 0.75 at. % or less, among them, particularly 0.20 at. % or more or 0.50 at. % or less with respect to Cs of CsI (cesium iodide), and it is preferable that as the content of thallium (Tl), thallium is included at a proportion of 0.015 at. % to 0.700 at. % with respect to Cs of CsI (cesium iodide).

Meanwhile, it is confirmed that it is preferable to perform doping with bismuth (Bi) such that the amount of bismuth (Bi) is 0.001 at. % to 0.100 at. %, among them, 0.001 at. % or more or 0.020 at. % or less, among them, 0.001 at. % or more or 0.010 at. % or less with respect to Cs of CsI (cesium iodide), and it is preferable that as the content of bismuth (Bi), bismuth is included at a proportion of $7.0 \times 10^{-6}$ at. % to $6.0 \times 10^{-3}$ at. % with respect to Cs of CsI (cesium iodide).

EXPLANATIONS OF LETTERS OR NUMERALS

1 Chamber
2 Induction heating coil
3 Alumina thermal insulating material
4 Quartz stage
5 Quartz tube
6 Quartz ampoule crucible
7 Quartz shaft
8 Pulling down mechanism
9 Support rod

The invention claimed is:

1. A scintillator comprising a crystal material including CsI (cesium iodide), as a host material, and thallium (Tl), as a luminescent center, and doped with bismuth (Bi).

2. The scintillator according to claim 1, wherein thallium (Tl) at a rate of 0.015 at. % to 0.700 at. % and bismuth (Bi) at a rate of $7.0 \times 10^{-6}$ at. % to $6.0 \times 10^{-3}$ at. % are included with respect to Cs of CsI (cesium iodide).

3. A scintillator obtained through crystal growth after mixing a raw material including a CsI raw material, a Tl raw material, and a Bi raw material, and melting the raw material by heating.

4. A radiation detector comprising the scintillator according to claim 1.

5. A method of reducing an afterglow of a scintillator comprising:
melting a raw material including a CsI (cesium iodide) raw material, a thallium (Tl) raw material, and a bismuth (Bi) raw material; and
growing a crystal from the melted material.

6. The method of claim 5, wherein thallium (Tl) is doped at a rate of 0.05 at. % to 1.00 at. % and bismuth (Bi) is doped at a rate of 0.001 at. % to 0.100 at. % with respect to Cs of CsI (cesium iodide) in the raw material.

7. The method of claim 5, wherein thallium (Tl) at a rate of 0.015 at. % to 0.700 at. % and bismuth (Bi) at a rate of $7.0 \times 10^{-6}$ at. % to $6.0 \times 10^{-3}$ at. % are included in the crystal with respect to Cs of CsI (cesium iodide).

8. The method of claim 6, wherein thallium (Tl) at a rate of 0.015 at. % to 0.700 at. % and bismuth (Bi) at a rate of $7.0 \times 10^{-6}$ at. % to $6.0 \times 10^{-3}$ at. % are included in the crystal with respect to Cs of CsI (cesium iodide).

9. A radiation detector comprising the scintillator according to claim 2.

10. A radiation detector comprising the scintillator according to claim 3.

* * * * *

UNITED STATES PATENT AND TRADEMARK OFFICE
CERTIFICATE OF CORRECTION

| | |
|---|---|
| PATENT NO. | : 9,678,223 B2 |
| APPLICATION NO. | : 14/239366 |
| DATED | : June 13, 2017 |
| INVENTOR(S) | : Daisuke Totsuka et al. |

Page 1 of 1

It is certified that error appears in the above-identified patent and that said Letters Patent is hereby corrected as shown below:

On the Title Page

Column 1, Item (73) Assignee, Line 1, delete "NIHON KESSHO KOGAKU., LTD.," and insert
-- NIHON KESSHO KOGAKU CO., LTD. --

Signed and Sealed this
Twenty-second Day of August, 2017

Joseph Matal
*Performing the Functions and Duties of the*
*Under Secretary of Commerce for Intellectual Property and*
*Director of the United States Patent and Trademark Office*